INVENTOR.

BY HAIG GOSHGARIAN

W. S. Hill

AGENT

INVENTOR.
BY HAIG GOSHGARIAN
W. S. Hill
AGENT

INVENTOR.
BY HAIG GOSHGARIAN
W. S. Hill
AGENT

INVENTOR.
BY HAIG GOSHGARIAN
W. S. Hill
AGENT

United States Patent Office
3,430,110
Patented Feb. 25, 1969

3,430,110
MONOLITHIC INTEGRATED CIRCUITS WITH A PLURALITY OF ISOLATION ZONES

Haig Goshgarian, Fords, N.J., assignor to Radio Corporation of America, a corporation of Delaware
Filed Dec. 2, 1965, Ser. No. 511,197
U.S. Cl. 317—234 5 Claims
Int. Cl. H01l 5/02

ABSTRACT OF THE DISCLOSURE

In an integrated circuit that includes a single crystal semiconductor body with a resistor comprising a diffused region of one conductivity type in a body portion of opposite type and wherein the body portion containing the resistor is isolated by a surrounding highly doped isolation zone of one conductivity type, the improvement comprising interposing another zone, highly doped and of opposite conductivity type, between the resistor and the isolation zone, for preventing current leakage due to spurious transistor action.

This invention relates to monolithic type semiconductor microcircuits, also commonly referred to as monolithic "integrated" circuits.

These circuits may contain active components, such as transistors and diodes, and passive components, such as capacitors and resistors. A type of resistor that has been commonly used in this type of circuit is made by diffusing impurities capable of imparting one type of conductivity into a portion of a single crystalline semiconductor body of opposite conductivity type. More particularly, the present invention relates to an improved environmental circuit structure for the diffused type resistor.

Monolithic semiconductor microcircuits are usually built into a semiconductor body which comprises a relatively thick substrate layer of one conductivity type which merely serves as a platform or handle, and a superimposed layer of opposite type. The circuit components are fabricated into the superimposed layer, usually by diffusing appropriate conductivity type determining impurities to form P–N junctions and P-type and N-type regions designed to function as transistors or diodes, or as resistors or capacitors.

One of the chief problems in fabricating this type of circuit has been to design it in such a way as to prevent, or at least minimize, unwanted interaction between components. Isolation of separate components has been accomplished in various ways. One of these is by introducing isolation zones or regions of conductivity type opposite that of the substrate so that P–N junctions are formed which prevent spurious electrical currents from travelling between different parts of the circuit through the semiconductor layer or substrate. However, even with this precaution, unwanted parasitic effects are still evidenced which undesirably affect circuit performance.

One of these undesirable effects exists in connection with diffused resistors which are isolated from the rest of the semiconductor circuit-containing layer by a surrounding region having the same type conductivity as the resistor, itself, but opposite type conductivity to the semiconductor layer in which the resistor is formed. It has now been discovered that an undesirable parasitic transistor action is present under these circumstances.

An object of the present invention is to provide a monolithic semiconductor microcircuit structure which includes an improved diffused resistor arrangement.

A further object of the invention is to provide an improved diffused resistor structure in a monolithic type microcircuit, having lower undesirable parasitic effects.

In general, the invention comprises a portion of a monolithic type semiconductor microcircuit which includes a semiconductor body, a resistor constituted by a first region of one conductivity type within this body, the resistor being surrounded by a second region of opposite conductivity type, this second region being isolated from the remainder of the body by a surrounding highly doped isolation zone of opposite conductivity type to the second region, and another zone between the second region and the isolation zone for preventing current leakage. The last-mentioned zone comprises a highly doped region of the same conductivity type as the second region.

Figure 2:
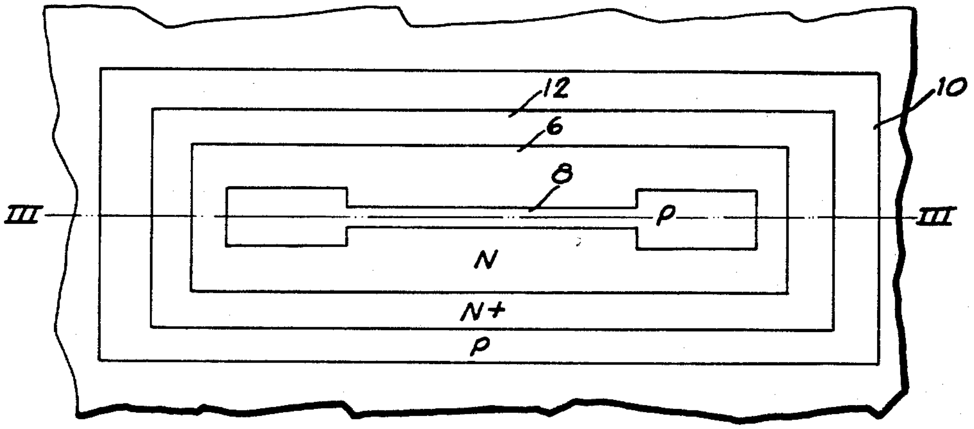
FIGURE 2 is a top plan view of a part of a circuit similar to that of FIGURE 1 but in accordance with an embodiment of the present invention.
Figure 3:
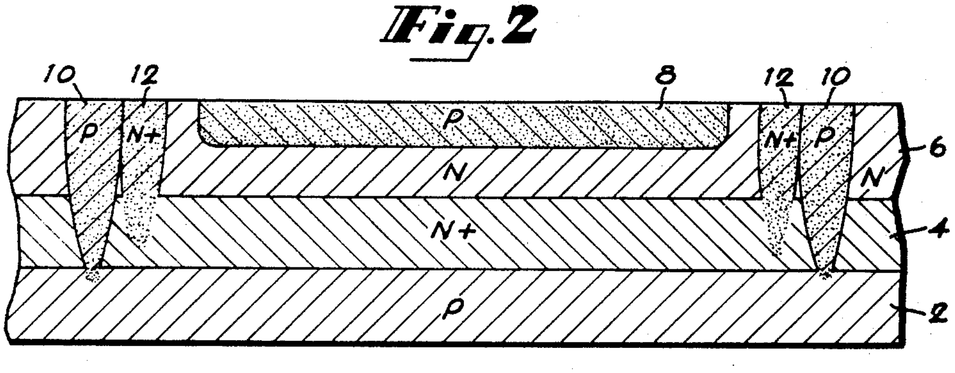
FIGURE 3 is a section view taken along the line III—III of FIGURE 2.
Figure 4A:
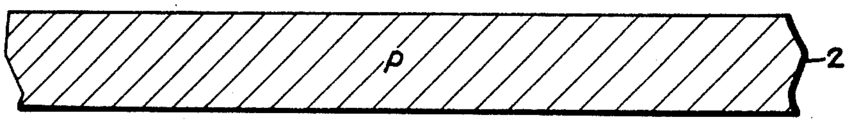
Figure 4B:
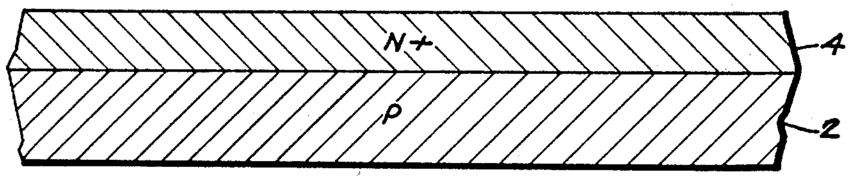
Figure 4C:
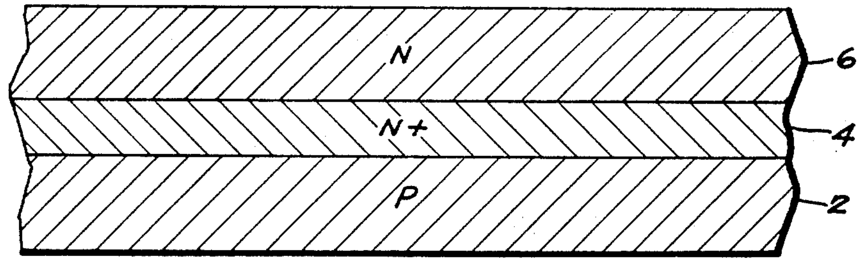
Figure 4D:
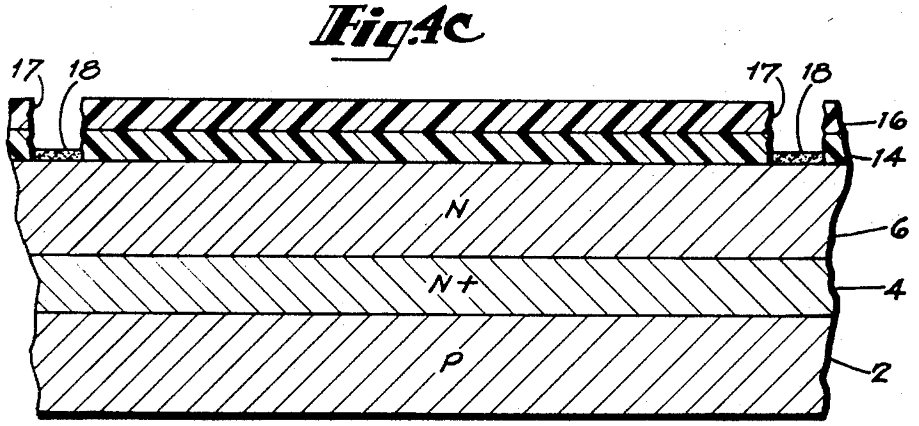
Figure 4E:
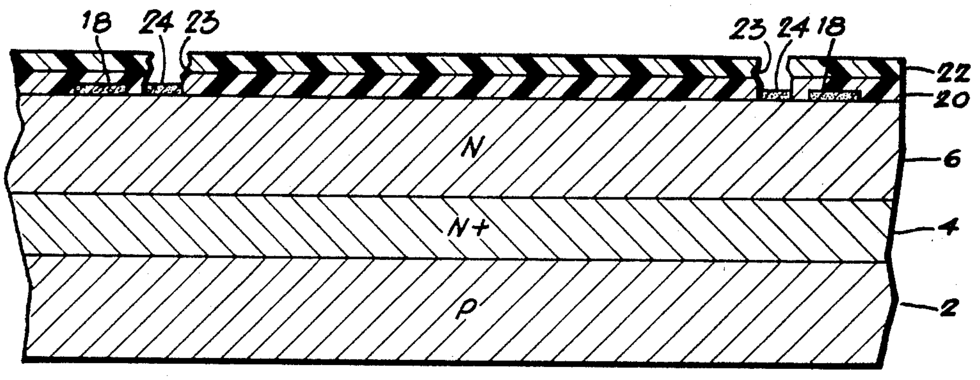
Figure 4F:
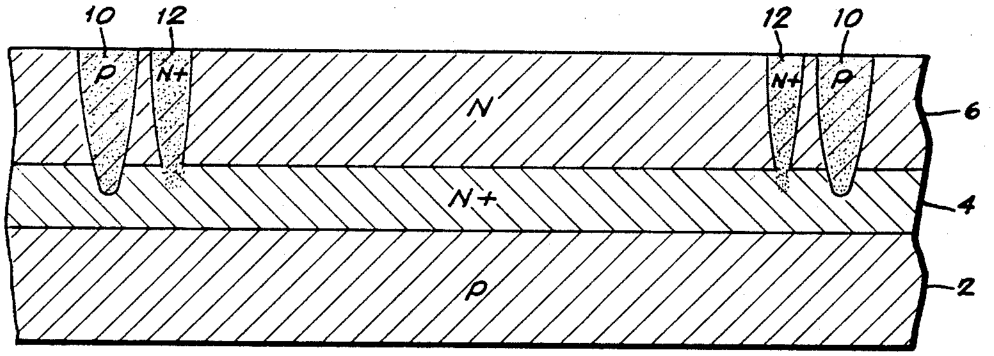
Figure 4G:
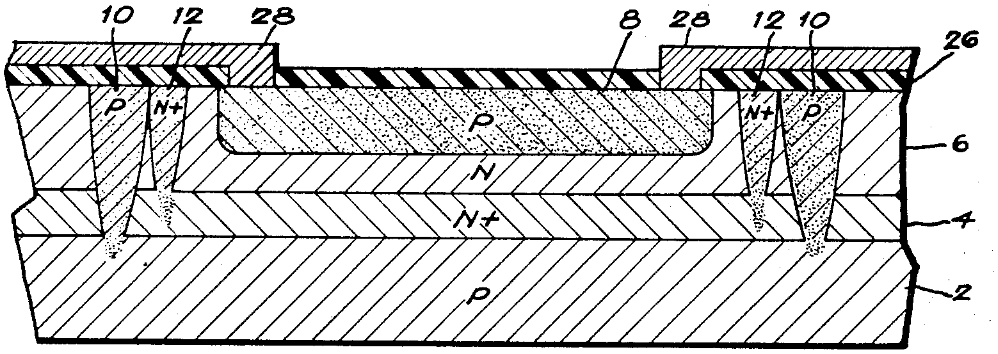
Figure 5:
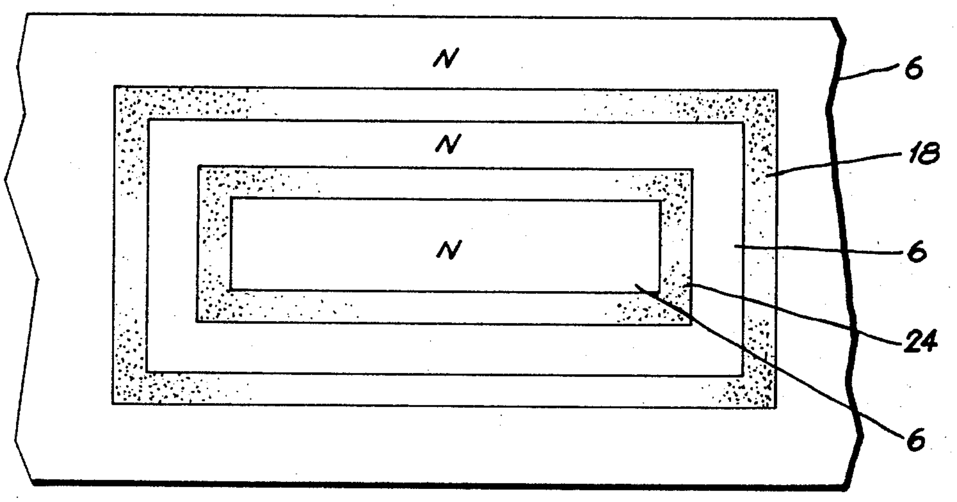
Figure 6:
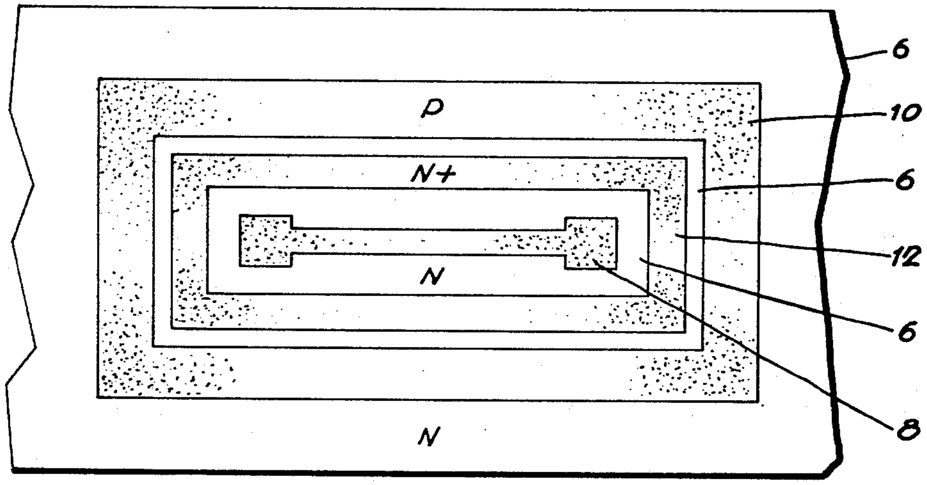

FIGURES 4*a* to 4*g* are section views, similar to FIGURE 3, illustrating successive steps in making the circuit portion of FIGURES 2 and 3;

FIGURE 5 is a top plan view of the circuit portion at the stage of manufacture shown in FIGURE 4*e* but with masking layers removed, and FIGURE 6 is a top plan view of a circuit portion in a stage of manufacture intermediate that shown in FIGURES 4*f* and 4*g*.

Figure 1:
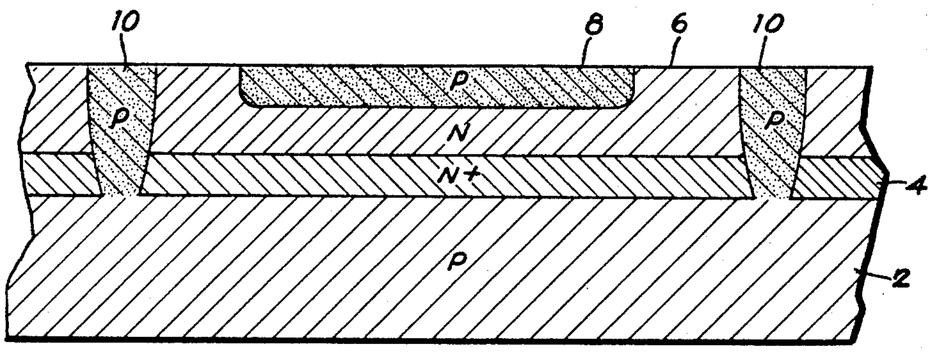
Fig. 1 (PRIOR ART)
FIGURE 1 is a section view of part of an integrated circuit of a prior art type.

FIGURE 1 shows a part of a typical prior art integrated circuit of the monolithic semiconductor type which includes a diffused type resistor that may be interconnected with various other circuit elements such as transistors, diodes, capacitors and other resistors. The part of the circuit shown comprises a composite semiconductor body that includes a P-type semiconductor substrate 2, an N+-type semiconductor layer 4 adjacent the substrate 2, and an N-type semiconductor layer 6 adjacent the layer 4. Included in the N layer 6 is a P-type region 8 which functions as a resistor in the complete circuit. When connected in circuit, metal connections (not shown) are made at the end portions of the exposed surface of the region 8 and an insulating layer (not shown) covers the entire exposed surface of the circuit portion except where the resistor connections are located. The resistor 8 is isolated from the rest of the circuit by means of P-type regions 10 which extend into the P-type substrate 2.

Although this type of circuit component isolation structure is convenient and economical to manufacture, it has obvious disadvantages. There are two transistors formed in this structure which introduce unwanted parasitics. One of these is a PNN+P transistor comprising the P-resistor region 8, and parts of the N layer 6, the N+ layer 4 and the P-type substrate 2. The effect of this transistor on circuit performance is not great, however, because the N+ layer 4 lowers the base resistance, thereby reducing the emitter efficiency of the PNP transistor, and thus keeping the "beta" of this transistor at a low value.

The other unwanted transistor comprises the P-type resistor region 8, the N layer 6 and the P isolation region 10 (which actually surrounds the N layer 6). This transistor may have a relatively large beta and it often has a substantial adverse effect on the operation of the circuit.

An embodiment of the improved circuit portion of the present invention is shown in FIGURES 2 and 3. As illustrated in these figures, a region 12 of relatively low resistivity is introduced into the layer 6 which surrounds the resistor 8 such that the region 12 is between the resistor 8 and the isolation region 10. In the embodiment shown, the added region 12 is of N+ conductivity. It will always be of the same conductivity type as the region 6 so that if the resistor is N-type and the surrounding region 6 is P type, the added region 12 will be P+-type.

The insertion of the N+ region between the P-type resistor 8 and the P isolation region 10 lowers the beta of the second parasitic transistor since that transistor now comprises the P-type resistor 8, the N layer 6, the N+ region 12 and the P isolation region 10. The N+ region in the base region of the parasitic transistor lowers the emitter efficiency and reduces the parasitic beta component to a level that can easily be tolerated.

The improved circuit portion of the present invention may be made as follows.

*Example*

Silicon monolithic circuits generally include a silicon single crystal substrate which serves as a convenient handle or platform to hold the circuit but plays no functional part in its operation. In the present example, the substrate 2 (FIGURE 4*a*) is a P-type single crystal silicon wafer 8 mils thick. The resistivity is 50 ohm-cm. and the doping impurity is boron. The thickness of this platform wafer is not critical but it must be thick enough to resist easy breakage in handling. Because of the expense involved, it is desirable that the platform wafer not be unnecessarily thick.

An N+ layer 4 is grown on the P-type substrate 2 (FIGURE 4*b*). This layer may be 2–8 microns thick and have a resistivity of about 0.02 ohm-cm. Antimony or arsenic are suitable doping agents for this layer. The N+ layer lowers the $V_{ce}$ of any NPN transistors that may be present in other parts of the circuit.

Next, an N-type layer 6 of silicon is epitaxially grown on the N+ layer 4 (FIGURE 4*c*). This layer may be 6–18 microns in thickness and may have a resistivity of as much as 20–30 ohm-cm. This layer serves as an isolation medium for the P-type resistor 8 and also serves as the collector for any NPN transistor which may be included in other parts of the circuit.

In order to make the P-type isolation region 10, a photomasking technique is used to define a particular surface area on which a stripe of the appropriate impurity substance is deposited for the diffusion steps. First, a coating of silicon dioxide 15 (FIGURE 4*d*) is deposited by any conventional method over the entire exposed top surface of the N layer 6. On top of the oxide layer 14 a layer 16 of a photoresist is deposited. This is exposed by conventional techniques, using a transparent master, and developed to wash off the unexposed part of the photoresist to, first, leave openings 17 at the bottoms of which the oxide layer 14 still remains. The oxide at the bottoms of openings 17 is etched away with hydrofluoric acid which exposes the surface of the layer 6. Then a boron compound such as $BBr_3$ is vapor deposited to form stripes 18 as shown in FIGURES 4*d* and 5.

Next, a stripe of N-type impurity 24 is laid down preparatory to forming the N+ isolation regions 12. In order to deposit the stripe 24, the layer 14 of silicon oxide and the photoresist layer 16 are removed and a new coating 20 (FIGURE 4*e*) of silicon dioxide is deposited on the surface of N-type layer 6 to be followed by a layer 22 of photoresist. Using the same kind of techniques used for forming the openings 17, new openings 23 are formed which extend down to the surface of the layer 6. A stripe 24 of N-type impurity is deposited at the bottom of openings 23, after which the oxide coating 20 and the photoresist coating 22 are again removed. The substance deposited to furnish the N-type impurity may be $POCl_3$, for example. Although these dimensions are not critical, the stripe 18 may be 0.5 mil wide and the stripe 24 may be 0.3 mil wide.

As shown in FIGURE 5, the stripes 18 and 24 are actually rectangular in shape and are arranged concentrically so that the stripe 24 encloses an area of the surface of the layer 6.

The assembly is now placed in a diffusion furnace where the impurities of the stripes 18 and 24 are diffused into the silicon body for at least about 16 hours at 1165° C. This forms P type isolation region 10 and N+ region 12. Since the impurities diffuse somewhat laterally as well as vertically, the stripes 18 and 24 become wider as the diffusion proceeds. Also, the N+ layer 4 expands in width.

Finally, the resistor 8 is formed using silicon dioxide and photoresist, as described above, to form a defined area opening and depositing a boron compound, such as boron nitride, in the form of a stripe having the shape shown in FIGURE 6 for the top of resistor region 8. The boron is diffused into the silicon body for 3–4 hours at 1100° C.

At the conclusion of the diffusion steps the resistor region 8 is complete and the isolation regions 10 and 12 are expanded in depth and width so that they merge with each other as shown in FIGURE 4*g*. The resistor may be connected to other parts of the circuit (not shown) by depositing an oxide layer 26 over the wafer surface and then depositing metal connections 28 extending over the oxide layer to the other components.

Although the N+ layer 4 has been illustrated as a complete layer epitaxially grown on the substrate 2, it may instead comprise a pocket diffused into the substrate 2. Also, it is possible to eliminate the N+ layer 4 entirely if the N layer 6 is made thicker so as to increase the emitter-collector spacing and reduce transistor beta in this manner.

What is claimed is:

1. In a microcircuit of the monolithic semiconductor type comprising a semiconducting body, a resistor constituted by a first region of a first type conductivity and of sufficiently high resistivity, within said body, said resistor being surrounded by a second region of a second type conductivity opposite that of said first type, said first resistor region and said second region being separated by a P–N junction, said second region being isolated laterally from the remainder of said body by a surrounding highly doped isolation zone of said first type conductivity, a P–N junction between said isolation zone and said second region, and another zone between said second region and said isolation zone for preventing current leakage, said another zone comprising a highly doped region of said second type conductivity, and spaced terminals on said resistor for connecting said resistor to other parts of said microcircuit.

2. A microcircuit according to claim 1 in which said another zone is a narrow N+ region laterally surrounding said resistor.

3. A microcircuit according to claim 1 in which said second region is underlain by a third region of said second type conductivity but of higher conductivity than said second region.

4. A microcircuit according to claim 1 in which said resistor comprises an elongated diffused region of P conductivity type.

5. A microcircuit according to claim 1 in which said second region is an epitaxial layer which is underlain by another layer which is of the same type conductivity as said second region but higher in conductivity.

(References on following page)

References Cited

UNITED STATES PATENTS

| | | | |
|---|---|---|---|
| 3,040,197 | 6/1962 | Gudmundsen | 307—88.5 |
| 3,138,747 | 6/1964 | Stewart | 317—235 |
| 3,258,606 | 6/1966 | Meadows | 307—88.5 |
| 3,260,902 | 7/1966 | Porter | 317—235 |
| 3,265,905 | 8/1966 | McNeil | 307—88.5 |
| 3,312,882 | 4/1967 | Pollock | 317—235 |
| 3,327,182 | 6/1967 | Kisinko | 317—235 |
| 3,229,119 | 1/1966 | Bohn et al. | 307—88.5 |
| 3,333,166 | 7/1967 | Hochman | 317—235 |
| 3,341,755 | 9/1967 | Husher et al. | 317—235 |
| 3,370,995 | 2/1968 | Lowery et al. | 148—175 |

JOHN W. HUCKERT, *Primary Examiner.*

R. SANDLER, *Assistant Examiner.*

U.S. Cl. X.R.

317—235